United States Patent
Xu et al.

(10) Patent No.: US 12,447,576 B2
(45) Date of Patent: *Oct. 21, 2025

(54) COMPENSATION FOR SLURRY COMPOSITION IN IN-SITU ELECTROMAGNETIC INDUCTIVE MONITORING

(71) Applicant: Applied Materials, Inc., Santa Clara, CA (US)

(72) Inventors: Kun Xu, Sunol, CA (US); Andrew Siordia, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/240,587

(22) Filed: Aug. 31, 2023

(65) Prior Publication Data
US 2024/0123565 A1 Apr. 18, 2024

Related U.S. Application Data

(63) Continuation of application No. 17/122,819, filed on Dec. 15, 2020, now Pat. No. 11,794,302.

(51) Int. Cl.
*B24B 37/005* (2012.01)
*B24B 37/04* (2012.01)
(Continued)

(52) U.S. Cl.
CPC .......... *B24B 37/005* (2013.01); *B24B 37/042* (2013.01); *B24B 37/10* (2013.01); *G01B 7/10* (2013.01)

(58) Field of Classification Search
CPC ..... B24B 37/005; B24B 37/042; B24B 37/10; B24B 49/105; B24B 49/10; B24B 49/02; B24B 49/04
(Continued)

(56) References Cited

U.S. PATENT DOCUMENTS

| 5,433,651 A | 7/1995 | Lustig |
| 5,559,428 A | 9/1996 | Li et al. |

(Continued)

FOREIGN PATENT DOCUMENTS

| CN | 1915595 | 2/2007 | |
| CN | 101413780 A | * 4/2009 | ........... B24B 37/042 |

(Continued)

OTHER PUBLICATIONS

English translation of CN101413780A (Year: 2009).*
(Continued)

*Primary Examiner* — David S Posigian
*Assistant Examiner* — Sukwoo James Chang
(74) *Attorney, Agent, or Firm* — Fish & Richardson P.C.

(57) ABSTRACT

A method of chemical mechanical polishing includes bringing a conductive layer of a substrate into contact with a polishing pad, supplying a polishing liquid to the polishing pad, generating relative motion between the substrate and the polishing pad, monitoring the substrate with an in-situ electromagnetic induction monitoring system as the conductive layer is polished to generate a sequence of signal values that depend on a thickness of the conductive layer, and determining a sequence of thickness values for the conductive layer based on the sequence of signal values. Determining the sequence of thickness values includes at least partially compensating for a contribution of the polishing liquid to the signal values.

17 Claims, 6 Drawing Sheets

(51) Int. Cl.
*B24B 37/10* (2012.01)
*G01B 7/06* (2006.01)

(58) Field of Classification Search
USPC .......................................................... 451/15
See application file for complete search history.

(56) References Cited

U.S. PATENT DOCUMENTS

| | | |
|---|---|---|
| 5,644,221 A | 7/1997 | Li et al. |
| 5,660,672 A | 8/1997 | Li et al. |
| 6,004,187 A | 12/1999 | Nyui et al. |
| 6,247,998 B1 | 6/2001 | Wiswesser et al. |
| 6,407,546 B1 | 6/2002 | Le et al. |
| 6,433,541 B1 | 8/2002 | Lehman et al. |
| 6,707,540 B1 | 3/2004 | Lehman et al. |
| 6,924,641 B1 | 8/2005 | Hanawa et al. |
| 6,975,107 B2 | 12/2005 | Hanawa et al. |
| 7,001,243 B1 | 2/2006 | Yi et al. |
| 8,106,651 B2 | 1/2012 | Lahiri et al. |
| 8,284,560 B2 | 10/2012 | Iravani et al. |
| 8,367,429 B2 | 2/2013 | Lee et al. |
| 9,362,186 B2 | 6/2016 | Kitajima et al. |
| 10,481,129 B1 | 11/2019 | Winecki et al. |
| 11,794,302 B2 | 10/2023 | Xu et al. |
| 2001/0008827 A1 | 7/2001 | Kimura et al. |
| 2002/0002029 A1 | 1/2002 | Kimura et al. |
| 2002/0013124 A1 | 1/2002 | Tsujimura et al. |
| 2002/0055192 A1 | 5/2002 | Bajaj et al. |
| 2002/0077031 A1 | 6/2002 | Johansson et al. |
| 2002/0098777 A1 | 7/2002 | Laursen et al. |
| 2002/0164925 A1 | 11/2002 | Swedek et al. |
| 2003/0028279 A1 | 2/2003 | Wang et al. |
| 2003/0181139 A1* | 9/2003 | Lehman ............... B24B 49/04 451/527 |
| 2004/0259470 A1 | 12/2004 | Swedek et al. |
| 2005/0024047 A1 | 2/2005 | Miller et al. |
| 2006/0009132 A1 | 1/2006 | Bennett et al. |
| 2009/0104847 A1 | 4/2009 | Kobayashi et al. |
| 2009/0263918 A1 | 10/2009 | Lahiri et al. |
| 2010/0099334 A1 | 4/2010 | Bennett et al. |
| 2011/0256805 A1 | 10/2011 | David et al. |
| 2012/0276661 A1 | 11/2012 | Iravani et al. |
| 2013/0000845 A1 | 1/2013 | Lu et al. |
| 2015/0011876 A1 | 1/2015 | Bouton |
| 2015/0118765 A1 | 4/2015 | Xu et al. |
| 2015/0224623 A1* | 8/2015 | Xu ...................... B24B 49/04 451/5 |
| 2015/0371907 A1 | 12/2015 | Lu et al. |
| 2018/0056476 A1 | 3/2018 | Zhang et al. |
| 2018/0203089 A1 | 7/2018 | Xu et al. |
| 2018/0304435 A1 | 10/2018 | Xu et al. |
| 2018/0311788 A1 | 11/2018 | Nakamura |
| 2019/0185715 A1 | 6/2019 | Wang et al. |
| 2019/0299356 A1 | 10/2019 | Xu et al. |
| 2019/0389028 A1 | 12/2019 | Lu et al. |
| 2020/0016722 A1 | 1/2020 | Nakamura |
| 2022/0184770 A1 | 6/2022 | Xu et al. |

FOREIGN PATENT DOCUMENTS

| | | |
|---|---|---|
| CN | 102683237 | 9/2012 |
| CN | 109414801 | 3/2019 |
| CN | 110178208 | 8/2019 |
| EP | 1063056 | 12/2000 |
| JP | H01310866 | 12/1989 |
| JP | 2004-153225 | 5/2004 |
| JP | 2009-099842 | 5/2009 |
| JP | 2010-042487 | 2/2010 |
| JP | 2017-506438 | 3/2017 |
| JP | 2018-183840 | 11/2018 |
| JP | 2020-011314 | 1/2020 |
| JP | 2021-528855 | 10/2021 |
| KR | 10-2002-0087437 A | 11/2002 |
| KR | 10-2016-0052216 | 5/2016 |
| KR | 10-2017-0015406 | 2/2017 |
| TW | 201027612 | 7/2010 |
| TW | 201843465 | 12/2018 |
| TW | 202012104 | 4/2020 |
| WO | WO 1999/45340 | 9/1999 |
| WO | WO 2015/123000 A1 | 8/2015 |

OTHER PUBLICATIONS

Office Action in Chinese Appln. No. 202111536628.X, dated Aug. 30, 2023, 14 pages (with English translation).

Office Action in Japanese Appln. No. 2021-198982, dated Dec. 23, 2022, 8 pages (with English translation).

Office Action in Taiwanese Appln. No.110146884, dated Mar. 13, 2023, 12 pages (with English search report).

Search Report in Japanese Appln. No. 2021-198982, mailed on Nov. 18, 2022, 37 pages (with English translation).

Office Action in Chinese Appln. No. 202111536628.X, dated Jul. 16, 2024, 9 pages (with English translation).

Office Action in Korean Appln. No. 10-2024-0079170, mailed on Apr. 4, 2025, 19 pages (with English translation).

* cited by examiner

COMPENSATION FOR SLURRY COMPOSITION IN IN-SITU ELECTROMAGNETIC INDUCTIVE MONITORING

CROSS-REFERENCE TO RELATED APPLICATIONS

This application is a continuation of U.S. application Ser. No. 17/122,819, filed on Dec. 15, 2020, the contents of which are hereby incorporated by reference.

TECHNICAL FIELD

The present disclosure relates to chemical mechanical polishing, and more specifically to monitoring of a conductive layer during chemical mechanical polishing.

BACKGROUND

An integrated circuit is typically formed on a substrate by the sequential deposition of conductive, semiconductive, or insulative layers on a silicon wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines to provide conductive paths between thin film circuits on the substrate.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. Polishing slurry with abrasive particles is typically supplied to the surface of the polishing pad.

One problem in CMP is determining whether the polishing process is complete, i.e., whether a substrate layer has been planarized to a desired flatness or thickness, or when a desired amount of material has been removed. Variations in the slurry composition, the polishing pad condition, the relative speed between the polishing pad and the substrate, the initial thickness of the substrate layer, and the load on the substrate can cause variations in the material removal rate. These variations cause variations in the time needed to reach the polishing endpoint. Therefore, determining the polishing endpoint merely as a function of polishing time can lead to non-uniformity within a wafer or from wafer to wafer.

In some systems, a substrate is monitored in-situ during polishing, e.g., through the polishing pad. One monitoring technique is to induce an eddy current in the conductive layer of the substrate and detect the change in the eddy current as the conductive layer is removed.

SUMMARY

In one aspect, a method of chemical mechanical polishing includes bringing a conductive layer of a substrate into contact with a polishing pad, supplying a polishing liquid to the polishing pad, generating relative motion between the substrate and the polishing pad, monitoring the substrate with an in-situ electromagnetic induction monitoring system as the conductive layer is polished to generate a sequence of signal values that depend on a thickness of the conductive layer, and determining a sequence of thickness values for the conductive layer based on the sequence of signal values. Determining the sequence of thickness values includes at least partially compensating for a contribution of the polishing liquid to the signal values.

In another aspect, a method of chemical mechanical polishing includes bringing a substrate having a conductive layer disposed over a semiconductor wafer into contact with a polishing pad, supplying a polishing liquid to the polishing pad, generating relative motion between the substrate and the polishing pad, receiving a polishing liquid base signal value, monitoring the substrate with an in-situ electromagnetic induction monitoring system as the conductive layer is polished to generate a sequence of signal values that depend on a thickness of the conductive layer, and determining a sequence of thickness values for the conductive layer based on the sequence of signal values and the polishing liquid base signal value.

Implementations may include one or more of the following advantages. Inaccuracy in the correlation between a measured eddy current signal and a conductive layer thickness caused by the polishing slurry, e.g., due to charged particles and ions in the slurry, can be reduced. An adjusted eddy current signal or an adjusted conductive layer thickness using the compensating processes can be more accurate. The adjusted eddy current signal and/or the adjusted conductive layer can be used for determining control parameters during a polishing process and/or determining an endpoint for the polishing process. Reliability of the control parameter determination and endpoint detection can be improved, wafer under-polish can be avoided, and within-wafer non-uniformity can be reduced.

The details of one or more implementations are set forth in the accompanying drawings and the description below. Other aspects, features, and advantages will be apparent from the description and drawings, and from the claims.

DETAILED DESCRIPTION

One monitoring technique for a polishing operation is to induce eddy currents in a conductive layer on a substrate, e.g., using an alternating current (AC) drive signal. The induced eddy currents can be measured by an eddy current sensor in-situ during polishing to generate a signal. Assuming the outermost layer undergoing polishing is a conductive layer, then the signal from the sensor should be dependent on the thickness of the conductive layer. Based on the monitoring, control parameters for the polishing operation, such as polishing rate, can be adjusted in-situ. In addition, the polishing operation can terminate based on an indication that the monitored thickness has reached a desired endpoint thickness.

In practice, the magnetic field generated by the eddy current sensor also passes through a thin layer of slurry between the substrate and the polishing pad. Without being limited to any particular theory, the charged abrasive particles in or ionic concentration of the slurry can affect the signal from the eddy current sensor. If calibration of the eddy current sensor is performed using a "blank" calibration wafer in the presence of DI water or without any liquid, then the sensor will be incorrectly calibrated and can generate inaccurate thickness measurements. However, techniques can be used to compensate for this inaccuracy, e.g., by performing calibration of the sensor in the presence of an appropriate slurry or by adjusting training data by taking into account the contribution to the signal from the slurry.

Accordingly, the electromagnetic induction measurements, including the eddy current signals and the measured thicknesses based on the eddy current signals, are adjusted based on the slurry composition.

Figure 1:
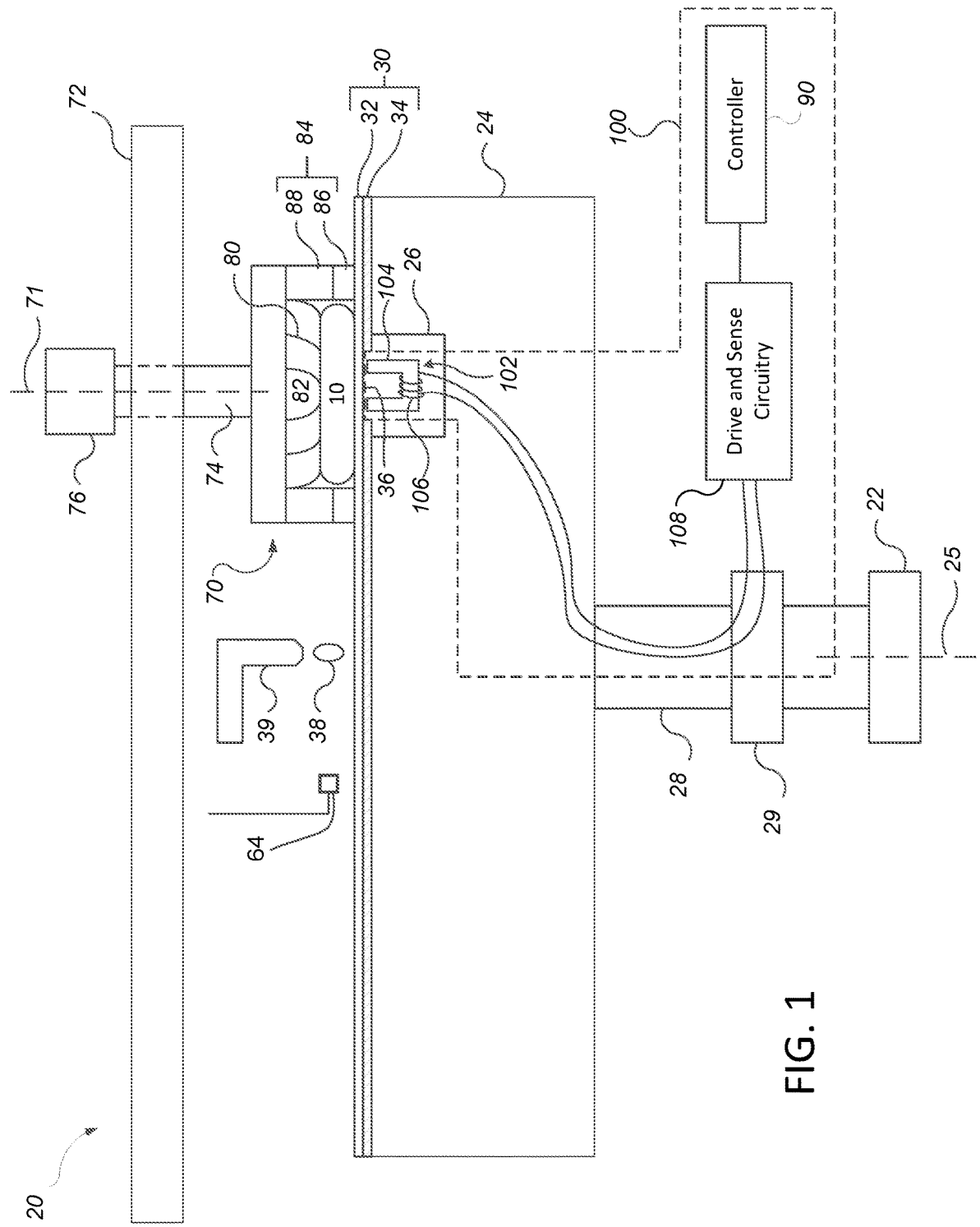
FIG. 1 illustrates a schematic cross-sectional view of an example of a polishing station including an electromagnetic induction monitoring system.
Figure 2:
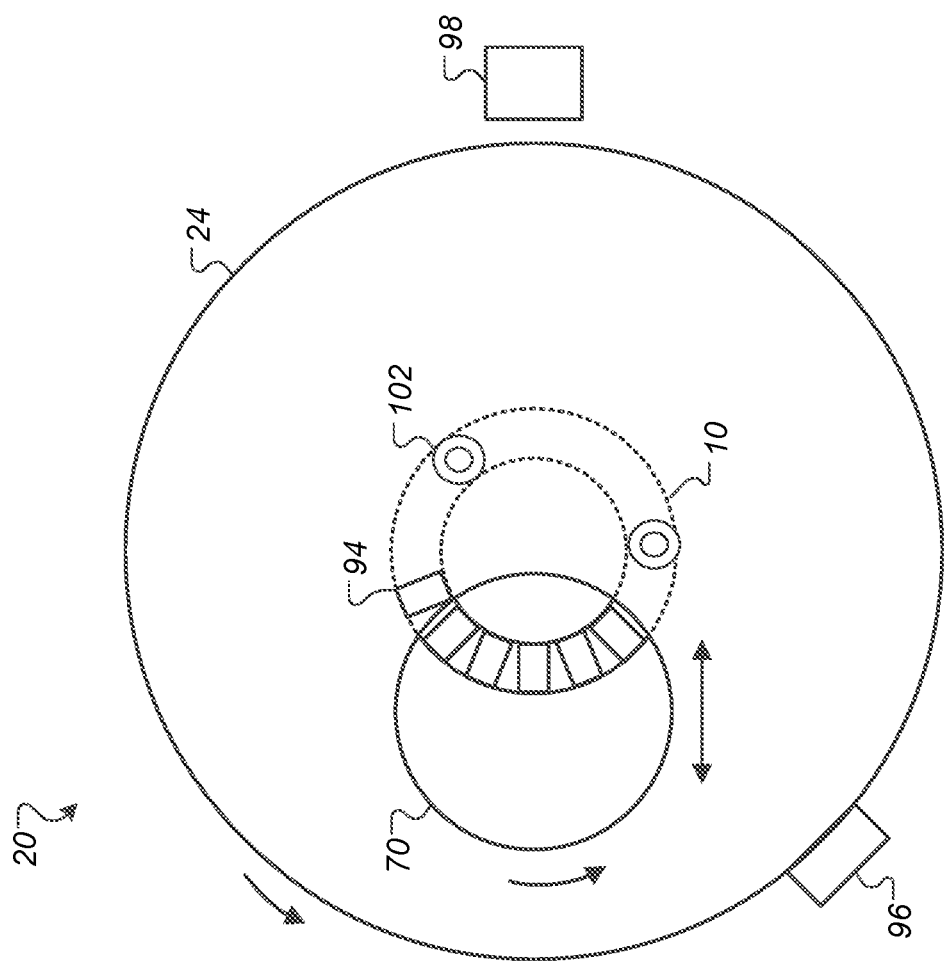
FIG. 2 illustrates a schematic top view of an example chemical mechanical polishing station showing a path of a sensor scan across a substrate.

FIGS. 1 and 2 illustrate an example of a polishing station 20 of a chemical mechanical polishing system. The polishing station 20 includes a rotatable disk-shaped platen 24 on which a polishing pad 30 is situated. The platen 24 is operable to rotate about an axis 25. For example, a motor 22 can turn a drive shaft 28 to rotate the platen 24. The polishing pad 30 can be a two-layer polishing pad with an outer polishing layer 32 and a softer backing layer 34.

The polishing station 20 can include a supply port or a combined supply-rinse arm 39 to dispense a polishing liquid 38, such as an abrasive slurry, onto the polishing pad 30. The polishing station 20 can include a pad conditioner apparatus with a conditioning disk to maintain the surface roughness of the polishing pad.

A carrier head 70 is operable to hold a substrate 10 against the polishing pad 30. The carrier head 70 is suspended from a support structure 72, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel, by movement along the track, or by rotational oscillation of the carousel itself.

The carrier head 70 can include a retaining ring 84 to hold the substrate. In some implementations, the retaining ring 84 may include a highly conductive portion, e.g., the carrier ring can include a thin lower plastic portion 86 that contacts the polishing pad, and a thick upper conductive portion 88. In some implementations, the highly conductive portion is a metal, e.g., the same metal as the layer being polished, e.g., copper.

In operation, the platen is rotated about its central axis 25, and the carrier head is rotated about its central axis 71 and translated laterally across the top surface of the polishing pad 30. Where there are multiple carrier heads, each carrier head 70 can have independent control of its polishing parameters, for example each carrier head can independently control the pressure applied to each respective substrate.

The carrier head 70 can include a flexible membrane 80 having a substrate mounting surface to contact the back side of the substrate 10, and a plurality of pressurizable chambers 82 to apply different pressures to different zones, e.g., different radial zones, on the substrate 10. The carrier head can also include a retaining ring 84 to hold the substrate.

In some implementations, the polishing station 20 includes a temperature sensor 64 to monitor a temperature in the polishing station or a component of/in the polishing station. Although illustrated in FIG. 1 as positioned to monitor the temperature of the polishing pad 30 and/or slurry 38 on the pad 30, the temperature sensor 64 could be positioned inside the carrier head 70 to measure the temperature of the substrate 10. The temperature sensor 64 can be in direct contact (i.e., a contacting sensor) with the polishing pad or the outermost layer of the substrate 10, which can be a conductive layer, to accurately monitor the temperature of the polishing pad or the outmost layer of the substrate. The temperature sensor can also be a non-contacting sensor (e.g., an infrared sensor). In some implementations, multiple temperature sensors are included in the polishing station 22, e.g., to measure temperatures of different components of/in the polishing station. The temperature(s) can be measured in real time, e.g., periodically and/or in association with the real-time measurements made by the eddy current system. The monitored temperature(s) can be used in adjusting the eddy current measurements in-situ.

Figure 3A:
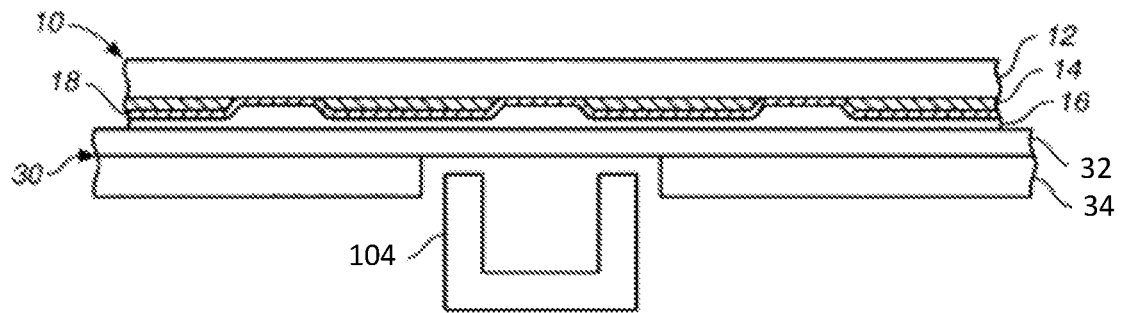
FIGS. 3A-3C are schematic cross-sectional views of a substrate illustrating a polishing process.

Referring to FIG. 3A, the polishing system can be used to polish a substrate 10 that includes a conductive material overlying and/or inlaid in a patterned dielectric layer. For example, the substrate 10 can include a layer of conductive material 16, e.g., a metal, e.g., copper, aluminum, cobalt or titanium, that overlies and fills trenches in a dielectric layer 14, e.g., silicon oxide or a high-k dielectric. Optionally a barrier layer 18, e.g., tantalum or tantalum nitride, can line the trenches and separate the conductive material 16 from the dielectric layer 14. The conductive material 16 in the trenches can provide vias, pads and/or interconnects in a completed integrated circuit. Although the dielectric layer 14 is illustrated as deposited directly on a semiconductor wafer 12, one or more other layers can be interposed between the dielectric layer 14 and the wafer 12.

The semiconductor wafer 12 can be a silicon wafer, e.g., single crystalline silicon, although other semiconductor materials are possible. In addition, the semiconductor wafer 12 can be doped, e.g., with p-type or n-type doping. The doping can be uniform laterally across the wafer, or the wafer can be selectively doped, e.g., as appropriate for fabrication of transistors in integrated circuits using the semiconductor wafer.

Figure 3B:
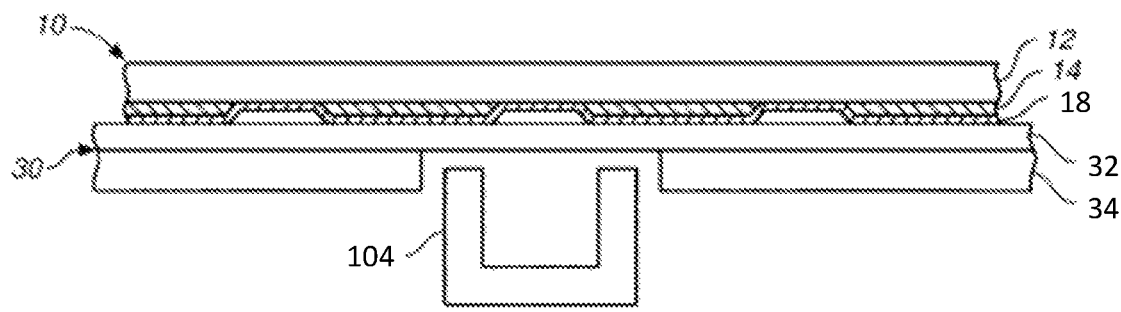
Figure 3C:
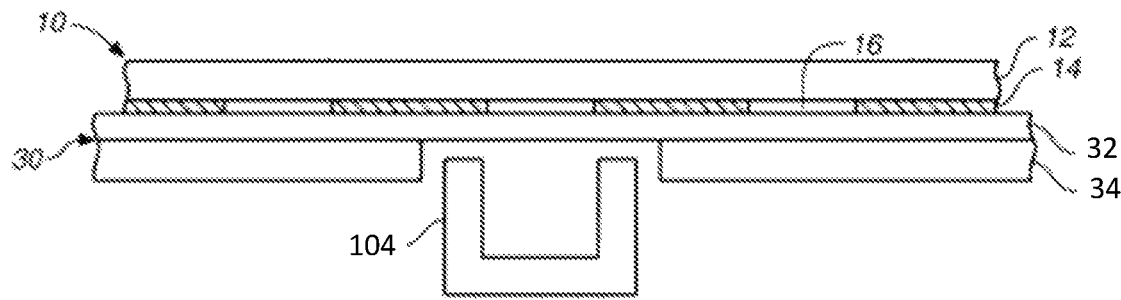

Initially, the conductive material 16 overlies the entire dielectric layer 14. As polishing progresses, the bulk of the conductive material 16 is removed, exposing the barrier layer 18 (see FIG. 3B). Continued polishing then exposes the patterned top surface of the dielectric layer 14 (see FIG. 3C). Additional polishing can then be used to control the depth of the trenches that contain the conductive material 16.

In some implementations, a polishing system includes additional polishing stations. For example, a polishing system can include two or three polishing stations. For example, the polishing system can include a first polishing station with a first electromagnetic induction monitoring system and a second polishing station with a second electromagnetic induction current monitoring system.

For example, in operation, bulk polishing of the conductive layer on the substrate can be performed at the first polishing station, and polishing can be halted when a target thickness of the conductive layer remains on the substrate. The substrate is then transferred to the second polishing station, and the substrate can be polished until an underlying layer, e.g., a patterned dielectric layer.

Returning to FIG. 1, the polishing system includes an in-situ electromagnetic induction monitoring system 100 which can be coupled to or be considered to include a controller 90. A rotary coupler 29 can be used to electrically connect components in the rotatable platen 24, e.g., the sensors of the in-situ monitoring systems, to components outside the platen, e.g., drive and sense circuitry or the controller 90.

The in-situ electromagnetic induction monitoring system 100 is configured to generate a signal that depends on a depth of the conductive material 16, e.g., the metal. The electromagnetic induction monitoring system can operate either by generation of eddy-currents in the conductive material, which can be either the sheet of conductive material that overlies the dielectric layer or the conductive material remaining in trenches after the dielectric layer is exposed, or generation of current in a conductive loop formed in a trench in the dielectric layer on the substrate.

In operation, the polishing system can use the in-situ monitoring system 100 to determine when the conductive layer has reached a target thickness, e.g., a target depth for metal in a trench or a target thickness for a metal layer overlying the dielectric layer, and then halts polishing. Alternatively or in addition, the polishing system can use the in-situ monitoring system 100 to determine differences in thickness of the conductive material 16 across the substrate 10, and use this information to adjust the pressure in one or more chambers 82 in the carrier head 80 during polishing in order to reduce polishing non-uniformity.

A recess 26 can be formed in the platen 24, and optionally a thin section 36 can be formed in the polishing pad 30 overlying the recess 26. The recess 26 and thin section 36 can be positioned such that regardless of the translational position of the carrier head they pass beneath substrate 10 during a portion of the platen rotation. Assuming that the polishing pad 30 is a two-layer pad, the thin section 36 can be constructed by removing a portion of the backing layer 32, and optionally by forming a recess in the bottom of the polishing layer 34. The thin section can optionally be optically transmissive, e.g., if an in-situ optical monitoring system is integrated into the platen 24.

The in-situ monitoring system 100 can include a sensor 102 installed in the recess 26. The sensor 102 can include a magnetic core 104 positioned at least partially in the recess 26, and at least one coil 106 wound around a portion of the core 104. Drive and sense circuitry 108 is electrically connected to the coil 106. The drive and sense circuitry 108 generates a signal that can be sent to the controller 90. Although illustrated as outside the platen 24, some or all of the drive and sense circuitry 108 can be installed in the platen 24.

Figure 4:
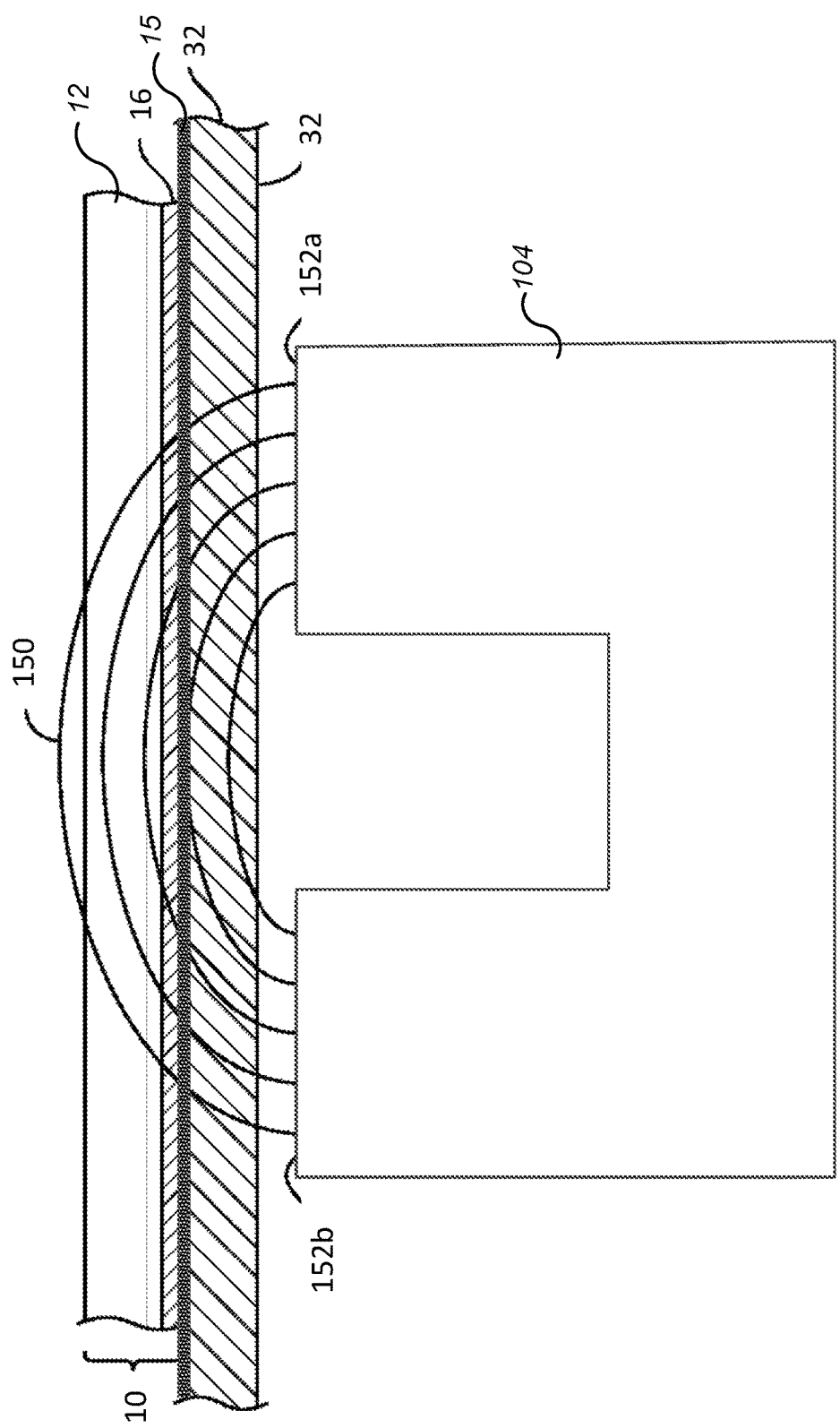
FIG. 4 is a schematic cross-sectional view illustrating an example magnetic field generated by an electromagnetic induction sensor.

Referring to FIGS. 1 and 4, the drive and sense circuitry 108 applies an AC current to the coil 106, which generates a magnetic field 150 between two poles 152*a* and 152*b* of the core 104. In operation, when the substrate 10 intermittently overlies the sensor 102, a portion of the magnetic field 150 extends into the substrate 10.

The circuitry 108 can include a capacitor connected in parallel with the coil 106. Together the coil 106 and the capacitor can form an LC resonant tank.

If monitoring of the thickness of a conductive layer on the substrate is desired, then when the magnetic field 150 reaches the conductive layer, the magnetic field 150 can pass through and generate a current (if the target is a loop) or create an eddy-current (if the target is a sheet). This modifies the effective impedance of the LC circuit.

However, the magnetic field 150 also penetrates into the slurry layer 15 formed between the conductive layer 16 and the polishing pad layer 32. As such, the effective impedance of the LC circuit, and thus the signal from the drive and sense circuitry 108, can also depend on the type of slurry used during polishing.

The drive and sense circuitry 108 can include a marginal oscillator coupled to a combined drive/sense coil 106, and the output signal can be a current required to maintain the peak to peak amplitude of the sinusoidal oscillation at a constant value, e.g., as described in U.S. Pat. No. 7,112,960. Other configurations are possible for the drive and sense circuitry 108. For example, separate drive and sense coils could be wound around the core. The drive and sense circuitry 108 can apply current at a fixed frequency, and the signal from the drive and sense circuitry 108 can be the phase shift of the current in the sense coil relative to the drive coil, or an amplitude of the sensed current, e.g., as described in U.S. Pat. No. 6,975,107.

Referring to FIG. 2, as the platen 24 rotates, the sensor 102 sweeps below the substrate 10. By sampling the signal from the circuitry 108 at a particular frequency, the circuitry 108 generates measurements at a sequence of sampling zones 94 across the substrate 10. For each sweep, measurements at one or more of the sampling zones 94 can be selected or combined. Thus, over multiple sweeps, the selected or combined measurements provide the time-varying sequence of values.

The polishing station 20 can also include a position sensor 96, such as an optical interrupter, to sense when the sensor 102 is underneath the substrate 10 and when the sensor 102 is off the substrate. For example, the position sensor 96 can be mounted at a fixed location opposite the carrier head 70. A flag 98 can be attached to the periphery of the platen 24. The point of attachment and length of the flag 98 is selected so that it can signal the position sensor 96 when the sensor 102 sweeps underneath the substrate 10.

Alternately or in addition, the polishing station 20 can include an encoder to determine the angular position of the platen 24.

Returning to FIG. 1, a controller 90, e.g., a general purpose programmable digital computer, receives the signals from sensor 102 of the in-situ monitoring system 100. Since the sensor 102 sweeps beneath the substrate 10 with each rotation of the platen 24, information on the depth of the conductive layer, e.g., the bulk layer or conductive material in the trenches, is accumulated in-situ (once per platen rotation). The controller 90 can be programmed to sample measurements from the in-situ monitoring system 100 when the substrate 10 generally overlies the sensor 102.

In addition, the controller 90 can be programmed to calculate the radial position of each measurement, and to sort the measurements into radial ranges. By arranging the measurements into radial ranges, the data on the conductive film thickness of each radial range can be fed into a controller (e.g., the controller 90) to adjust the polishing pressure profile applied by a carrier head. The controller 90 can also be programmed to apply endpoint detection logic to the sequence of measurements generated by the in-situ monitoring system 100 signals and detect a polishing endpoint.

Since the sensor 102 sweeps underneath the substrate 10 with each rotation of the platen 24, information on the conductive layer thickness is being accumulated in-situ and on a continuous real-time basis. During polishing, the measurements from the sensor 102 can be displayed on an output device to permit an operator of the polishing station to visually monitor the progress of the polishing operation.

As an eddy current monitoring system, the electromagnetic induction monitoring system 100 can be used to monitor the thickness of a conductive layer by inducing eddy currents in the conductive sheet, or to monitor the depth of a conductive material in a trench by inducing eddy currents in the conductive material. Alternatively, as an inductive monitoring system, the electromagnetic induction monitoring system can operate by inductively generating a current in a conductive loop formed in the dielectric layer 14 of the substrate 10 for the purpose of monitoring, e.g., as described in U.S. Patent Publication No. 2015-0371907.

Figure 5:
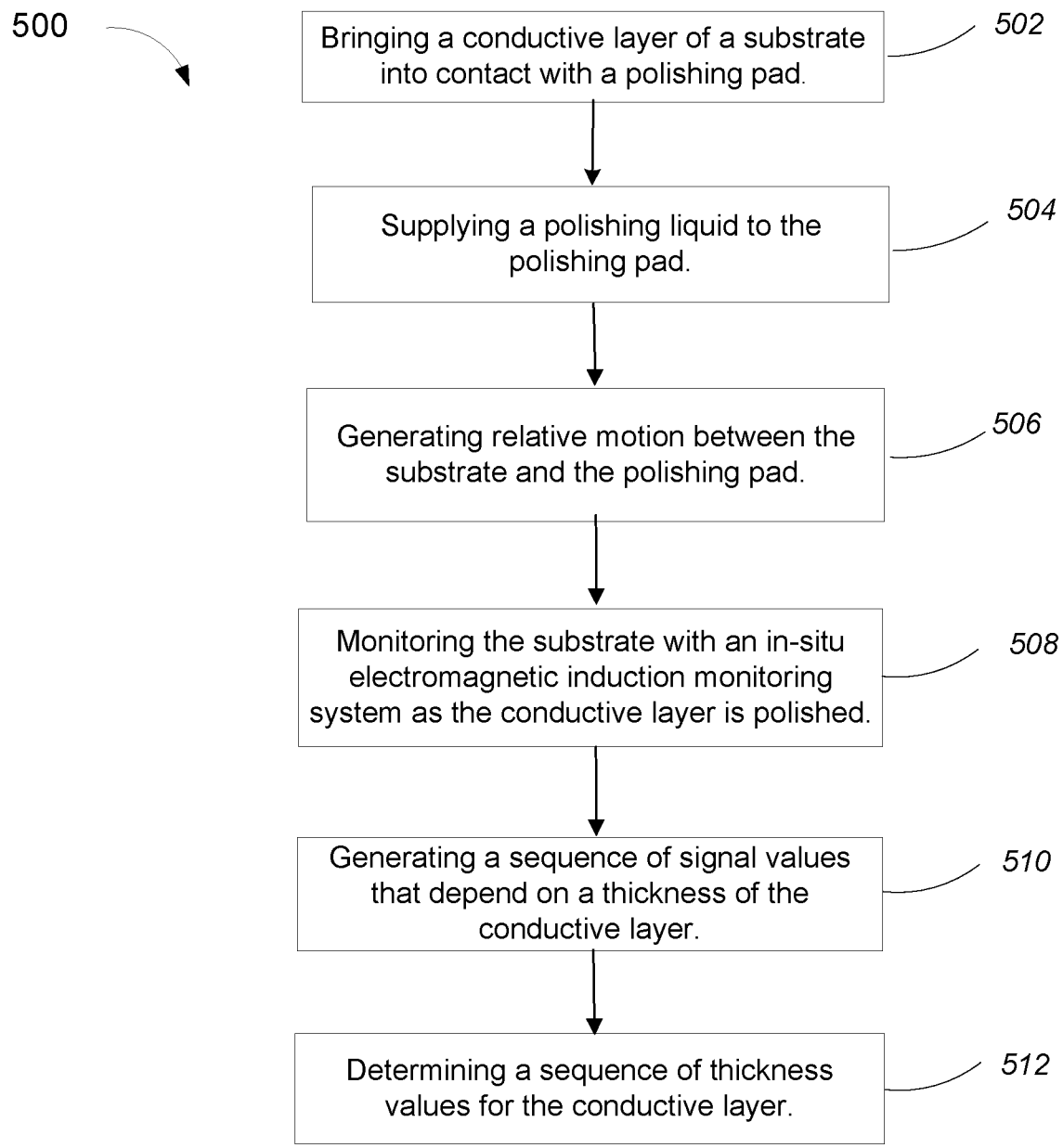
FIG. 5 is a flow diagram of a method for monitoring a conductive layer thickness.
Figure 6:
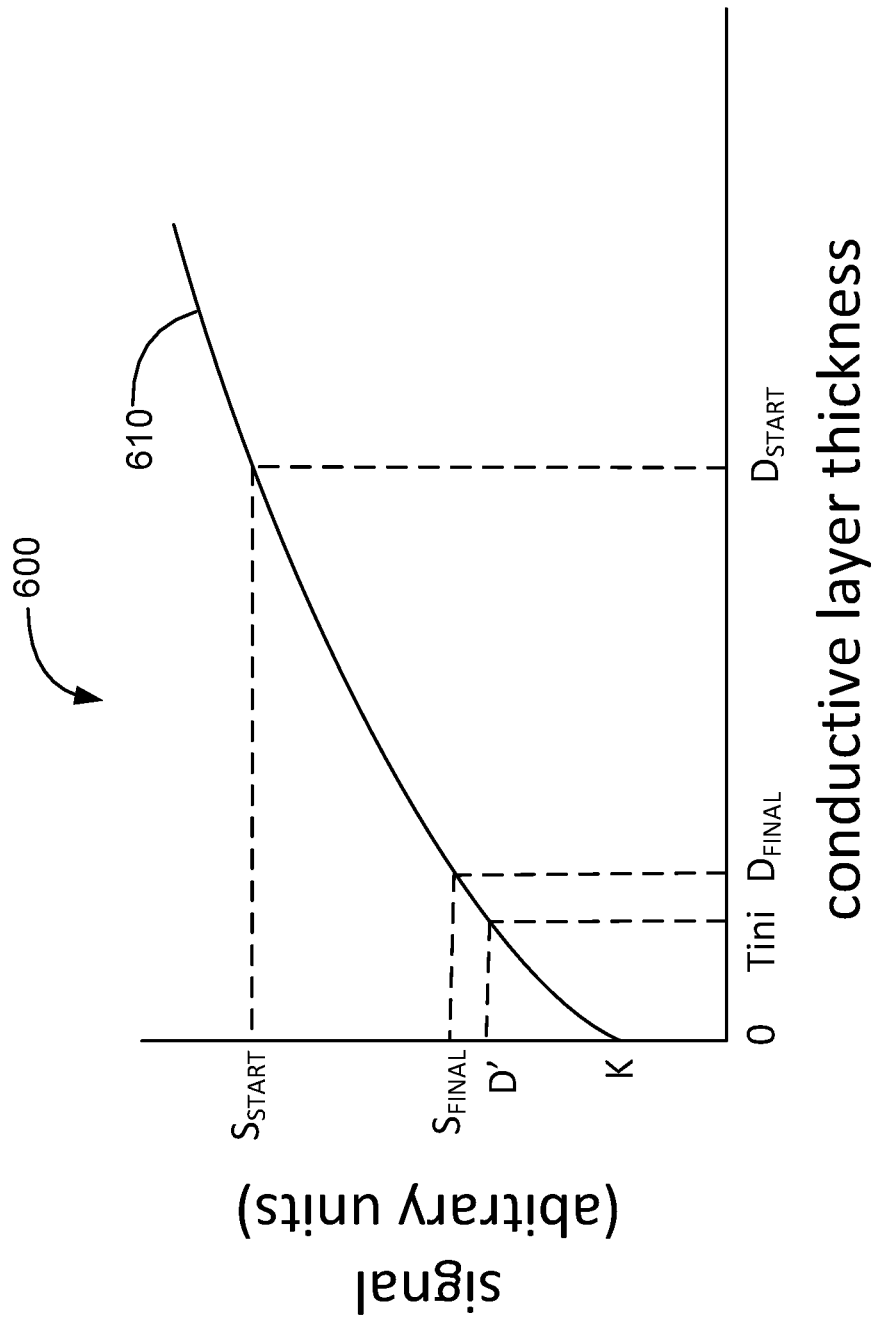
FIG. 6 illustrates a graph of an example eddy current phase signal as a function of conductive layer thickness.

FIG. 5 is a flow diagram of a method 500 for monitoring a conductive layer thickness. For polishing, a contact between the conductive layer of the substrate and the polishing pad is established (502). A polishing liquid (e.g., slurry) is supplied to the polishing pad for polishing of the substrate (504). The method 500 also uses an eddy current sensor. The eddy current sensor allows thickness measurements of the conductive layer. However the is sensitive to the presence of the slurry under and outside of the substrate during polishing. Different types of slurry can affect the signal from the sensor, and absent compensation thus affect the thickness measurements of the conductive layer. Therefore, before thickness measurements of the conductive layer are collected the sensor is calibrated. The calibration is done using a set of calibration substrates that have a known thickness. A plurality of metrology thickness measurements are collected from one or more conductive layers on one or more of the calibration substrates. The measurements are collected with the in-situ electromagnetic induction monitoring system without the distorting effects of the slurry, e.g., in the presence of deionized water, generate a plurality of test substrate signal values. These measurements are used to calculate the initial coefficients from the plurality of test substrate signal values. To accurately estimate the thickness of the conductive layer the relationship can be represented in the controller 90 by a function, e.g., a polynomial function, e.g., a second order function, a third order function, or a higher order function. Absent the slurry, the correlation between the signal S and the conductive layer thickness D can be represented by the equation:

$$S = W_1 \cdot D^2 + W_2 \cdot D + W_3 \qquad \text{(Equation 1)}$$

where $W_1$, $W_2$, and $W_3$ are real number coefficients. Thus, the controller can store the values of the coefficients of the function, e.g., $W_1$, $W_2$, and $W_3$, as well as the resistivity $\rho_0$ for which the relationship curve 610 applies (FIG. 6). In addition, the relationship could be represented with a linear function, a Bezier curve, or a non-polynomial function, e.g., exponential or logarithmic.

However, as noted above, the signal generated by the eddy current sensor also includes the contribution from the slurry. Without being limited by any particular theory, because the eddy currents pass through the slurry layer and the conductive layer, the power dissipates into both layers. Experiments show that the effect of the slurry is more pronounced for highly resistive films. For example, in a metal film with resistivity of 30000 ohmA, an example slurry added 440 A to the calculated thickness of the metal film. In order to compensate for the effect of the slurry, equation 1 can be modified to include the contribution of the slurry. A representative calibration sample is selected from the set of samples and slurry is applied during polishing in order to obtain an offset value that compensates for the slurry into the thickness measurements.

As such, the signal S can be represented as $S = f(D-s)$ where $f( )$ is the function used to represent the relationship curve, e.g., the second order or higher polynomial function, D is the thickness of the conductive layer, and s is an equivalent conductive layer thickness contribution from the slurry.

For example, the correlation between the signal S and the thickness D can be represented by the equation 2:

$$S = W_1 \cdot (D-s)^2 + W_2 \cdot (D-s) + W_3 \qquad \text{(Equation 2)}$$

The equivalent conductive layer thickness with compensated for the presence of slurry can be determined by placing a calibrated wafer into the polishing station and measuring the signal S in presence of slurry. The slurry is the same slurry as the one used in device fabrication. The equivalent conductive layer thickness value s will be different for each different type of slurry used during polishing. For example, one slurry can be used per lot fabrication, and the signal S can be measured for that type of slurry.

Once the equivalent conductive layer thickness contribution s (or the offset value) is known, a modified (i.e., slurry compensated) correlation function can be determined. For example, the modified correlation between the signal S and the thickness D can be represented by the equation 3:

$$S = W'_1 \cdot D^2 + W'_2 \cdot D + W'_3 \qquad \text{(Equation 3)}$$

The controller can determine adjusted coefficients $W'_1$, $W'_2$ and $W'_3$ from the initial coefficients $W_1$, $W_2$, $W_3$ and the equivalent conductive layer thickness contribution s of the slurry. For example, $$W'_1 = W_1$$

$$W'_2 = W_2 - 2s*W_1$$

$$W'_3 = s^2*W_1 - s*W_2 + W_3$$

As the conducive layer is polished the substrate is monitored with the monitoring system using the slurry compensated function for a particular slurry type (508). A sequence of values S(t) for the signal are received over time from the in-situ monitoring system (510). The value S(t) can be used to calculate a thickness value D(t) using the modified correlation function (e.g., Equation 3 above), thus providing a sequence of thickness values D(t) (512).

In some implementations, the values S(t) are normalized. For example, a calibrated signal S' can be generated according to $$S' = G*S - \Delta K \qquad \text{(Equation 4)}$$

where G is a gain and $\Delta K$ is an offset, but determined experimentally for the in-situ monitoring system using a blank wafer having a conductive layer of known thickness and conductivity.

In addition, each thickness value can be adjusted based on the resistivity of the layer to provide a corrected thickness value, thus providing a sequence of corrected thickness values D'(t). The corrected thickness values can be calculated as follows:

$$D'(t) = D(t)*(\rho_x/\rho_0) \qquad \text{(Equation 5)}$$

where $\rho_x$ is the resistivity of the conductive layer, and $\rho_0$ is the resistivity for which the relationship curve 610 (and the values $W_1$, $W_2$, $W_3$) applies.

The corrected thickness values D'(t) can be used for control of the polishing parameters, e.g., for calculation of polishing pressures to reduce non-uniformity.

Endpoint can be called when the thickness value D(t) or corrected thickness value D'(t) reaches a target thickness value $D_{TARGET}$.

FIG. 6 shows a graph 600 that illustrates a relationship curve 610, for a given resistivity, between the thickness of the conductive layer and the signal from the electromagnetic induction monitoring system 100. In the graph 600, $D_{START}$ represents the initial thickness of the conductive layer, $S_{START}$ is the desired signal value corresponding to the initial thickness $D_{START}$; $D_{FINAL}$ represents the final thickness of the conductive layer, and $S_{FINAL}$ is the desired signal value correspond to the final thickness; and K is a constant representing a value of the signal for zero conductive layer thickness.

In addition to the substrate-to-substrate variations in resistivity, changes in temperature of the layer can result in a change in the resistance of the conductive layer. For example, the conductive layer may become hotter as polishing progresses, and thus more conductive (lower resistivity). In particular, the controller carrying out the process can also calculate a resistivity $\rho_T$ of the conductive layer at the real time temperature T(t). The real time temperature T(t) can be determined from the temperature sensor 64. In some implementations, the adjusted resistivity $\rho_T$ is calculated based on the following equation:

$$\rho_T=\rho_X[1+\alpha(T(t)-T_{ini})]$$

where $T_{ini}$ is the initial temperature of the conductive layer when the polishing process starts. The adjusted resistivity $\rho_T$ is then used in place of the resistivity $\rho_X$, e.g., in Equations 5 above (or in calculation of the gain and offset in Equation 4).

In situations where the polishing process is carried out under room temperature, $T_{ini}$ can take the approximate value of 20° C. $\rho_X$ is the resistivity of the conductive layer at $T_{ini}$, which can be room temperature. Typically, α is a known value that can be found in literature or can be obtained from experiment.

In some implementations, the temperatures T and $T_{ini}$, used in adjusting the measured eddy current signal are the temperature of the conductive layer, e.g., as measured by a temperature sensor in the carrier head. In some implementations, the temperatures T and $T_{ini}$ can be the temperatures of the polishing pad or the temperatures of the slurry instead of the temperatures of the conductive layer.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used to refer to relative positioning within the system or substrate; it should be understood that the polishing surface and substrate can be held in a vertical orientation or some other orientation during the polishing operation.

Functional operations of the controller 90 can be implemented using one or more computer program products, i.e., one or more computer programs tangibly embodied in a non-transitory computer readable storage media, for execution by, or to control the operation of, data processing apparatus, e.g., a programmable processor, a computer, or multiple processors or computers.

A number of embodiments of the invention have been described. Nevertheless, it will be understood that various modifications may be made without departing from the spirit and scope of the invention. Accordingly, other embodiments are within the scope of the following claims.

What is claimed is:

1. A computer program product tangibly comprising a non-transitory computer readable storage medium comprising instructions to cause a computer system to:
   store a polishing liquid signal contribution value representing a contribution of a polishing liquid to signals generated by an in-situ electromagnetic induction monitoring system, manifested by a change to an impedance formed by a circuit of the in-situ electromagnetic induction monitoring system during polishing of a substrate in a presence of the polishing liquid;
   receive a sequence of signal values from a sensor of the in-situ electromagnetic induction monitoring system as a conductive layer of the substrate is polished in the presence of the polishing liquid in a polishing system;
   determine a sequence of thickness values for the conductive layer based on the sequence of signal values manifested by the change to the impedance from the sensor of the in-situ electromagnetic induction monitoring system and the polishing liquid signal contribution value; and
   adjust a polishing parameter of the polishing system based on the sequence of thickness values to modify polishing of the substrate.

2. The computer program product of claim 1, comprising instructions to store one or more initial coefficients of a function that correlates the signal values to respective thicknesses, to calculate adjusted coefficients based on the initial coefficients and the polishing liquid signal contribution value, and to calculate thickness values from signal values using the function with the adjusted coefficients.

3. The computer program product of claim 2, wherein the function comprises a polynomial function of second or greater order.

4. The computer program product of claim 3, wherein the function comprises $$S=W'_1*D^2+W'_2*D+W'_3$$

where S represents the signal values, D represents the thickness values, and $W'_1$, $W'_2$, and $W'_3$ are adjusted coefficients.

5. The computer program product of claim 4, wherein the polishing liquid signal contribution value is represented as an equivalent conductive layer thickness value.

6. The computer program product of claim 5, wherein the adjusted coefficients satisfy $$W'_1=W_1$$

$$W'_2=W_2-2s*W_1$$

$$W'_3=W_3-s*W_2+2s*W_1$$

where s is the polishing liquid signal contribution value, and $W_1$, $W_2$, and $W_3$ are the initial coefficients.

7. The computer program product of claim 1, wherein the polishing liquid signal contribution value is represented as an equivalent conductive layer thickness value.

8. A computer program product tangibly comprising a non-transitory computer readable storage medium comprising instructions to cause a computer system to:
   store a polishing liquid signal contribution value representing a contribution of a polishing liquid to signals generated by an in-situ electromagnetic induction monitoring system, manifested by a change to an impedance formed by a circuit of the in-situ electromagnetic induction monitoring system during polishing of a substrate in a presence of the polishing liquid;

receive a sequence of signal values from a sensor of the in-situ electromagnetic induction monitoring system as a conductive layer of the substrate is polished in the presence of the polishing liquid in a polishing system;

determine a sequence of thickness values for the conductive layer based on the sequence of signal values manifested by the change to the impedance formed by the circuit of the in-situ electromagnetic induction monitoring system from the sensor of the in-situ electromagnetic induction monitoring system and the polishing liquid signal contribution value; and adjust a polishing parameter of the polishing system based on the sequence of thickness values to modify polishing of the substrate, wherein the polishing liquid signal contribution value represents a signal value manifested by the change to the impedance from the in-situ electromagnetic induction monitoring system measured in the presence of the polishing liquid and a calibration substrate having a conductive layer of known thickness.

9. The computer program product of claim 8, comprising instructions to determine an equivalent conductive layer thickness value from a function that correlates the signal values to the thickness values and the polishing liquid signal contribution value.

10. The computer program product of claim 9, wherein the function comprises $$S = W_1 \cdot (D-s)^2 + W_2 \cdot (D-s) + W_3$$

where s is the equivalent conductive layer thickness value, D is the known thickness of the conductive layer, S is the polishing liquid signal contribution value, and W1, W2, and W3 are initial coefficients.

11. A polishing system, comprising:
a rotatable platen to support a polishing pad;
a carrier head to hold a substrate against the polishing pad;
a dispenser to supply a polishing liquid to the polishing pad;
an in-situ electromagnetic induction monitoring system including a sensor configured to generate a sequence of signal values that depend on a thickness of a conductive layer on the substrate and composition of the polishing liquid; and
a controller configured to
store a polishing liquid signal contribution value representing a contribution of the polishing liquid to signals, generated by the in-situ electromagnetic induction monitoring system, manifested by a change to an impedance formed by a circuit of the in-situ electromagnetic induction monitoring system during polishing of the substrate in a presence of the polishing liquid, receive the sequence of signal values from the in-situ electromagnetic induction monitoring system as the conductive layer is polished in the presence of the polishing liquid, determine a sequence of thickness values for the conductive layer based on the sequence of signal values manifested by the change to the impedance from the in-situ electromagnetic induction monitoring system and the polishing liquid signal contribution value, and adjust a polishing parameter of the polishing system based on the sequence of thickness values to modify polishing of the substrate.

12. The polishing system of claim 11, wherein the polishing liquid signal contribution value is represented as an equivalent conductive layer thickness value.

13. The polishing system of claim 11, wherein the controller is configured to store one or more initial coefficients of a function that correlates the signal values to the thickness values, to calculate adjusted coefficients based on the initial coefficients and the polishing liquid signal contribution value, and to calculate thickness values from signal values using the function with the adjusted coefficients.

14. The polishing system of claim 13, wherein the function comprises a polynomial function of second or greater order.

15. The polishing system of claim 14, wherein the function comprises $$S = W'_1 * D^2 + W'_2 * D + W'_3$$

where S represents the signal values, D is the thickness, and $W'_1$, $W'_2$, and $W'_3$ are adjusted coefficients.

16. The polishing system of claim 14, wherein the function comprises $$S = W_1 \cdot (D-s)^2 + W_2 \cdot (D-s) + W_3$$

where S represents the signal values, s is an equivalent conductive layer thickness value, W1, W2, and W3 are initial coefficients, and D represents the thickness values.

17. The polishing system of claim 16, wherein the adjusted coefficients satisfy $$W'_1 = W_1$$

$$W'_2 = W_2 - 2s * W_1$$

$$W'_3 = W_3 - S * W_2 + 2s * W_1$$

where s is the polishing liquid signal contribution value, and $W_1$, $W_2$, and $W_3$ are the initial coefficients.

* * * * *

UNITED STATES PATENT AND TRADEMARK OFFICE
CERTIFICATE OF CORRECTION

Page 1 of 1

PATENT NO. : 12,447,576 B2
APPLICATION NO. : 18/240587
DATED : October 21, 2025
INVENTOR(S) : Kun Xu and Andrew Siordia It is certified that error appears in the above-identified patent and that said Letters Patent is hereby corrected as shown below:

In the Claims

In Column 12, Line 45, Claim 17, delete "$W'_2 - W_2 – 2s*W_1$" and insert -- $W'_2 = W_2 – 2s*W_1$ --.

In Column 12, Line 46, Claim 17, delete "$W'_3 = W_3 – S*W_2 + 2s*W_1$" and insert -- $W'_3 = W_3 – s*W_2 + 2s*W_1$ --.

Signed and Sealed this
Tenth Day of February, 2026

John A. Squires
*Director of the United States Patent and Trademark Office*